INVENTOR.
JOSEPH C. AULT
BY
Dugger Braddock Johnson & Westman
ATTORNEYS

INVENTOR.
JOSEPH C. AULT
BY
Dugger Braddock Johnson & Westman
ATTORNEYS

United States Patent Office 3,165,649

Patented Jan. 12, 1965

3,165,649

QUICK TURN-OFF CIRCUIT USING TUNNEL DIODE AND INDUCTIVE KICK TO EFFECT OFF CONDITION

Joseph C. Ault, Minneapolis, Minn., assignor to Ault Incorporated, a corporation of Minnesota Filed Sept. 4, 1962, Ser. No. 221,127
4 Claims. (Cl. 307—88.5)

This invention has relation to an electrical circuit supplying power to a load, which circuit has the capability of very quickly removing the power from the load.

The circuit and the various novel entities in the circuit are shown in connection with the supply of direct current power to a load through the instrumentality of a switching type direct current power source which is controlled by a magnetic amplifier acting as a pulse width modulator, the alternating current power for which is supplied by a transistorized inverter. The switching type direct current power source is biased to cut-off during the absence of magnetic amplifier pulses.

This selection of context in which to demonstrate the various novel entities of the invention is to be considered as illustrative only, it being understood that these novel entities can be utilized effectively in many other circuit situations.

In the device as shown, the D.C. power supply includes a full wave rectifier having two diodes and two silicon controlled rectifiers. The gates of these two silicon controlled rectifiers are connected to the output from a magnetic amplifier in order to control the output of the direct current power source to the load.

A narrow junction degenerate semiconductor device such as a tunnel diode is employed to very accurately measure and limit the amount of current which can flow to the load, and the characteristics of this tunnel diode are used to immediately interrupt the alternating current excitation to the magnetic amplifier and hence to the gates of the silicon controlled rectifiers as soon as a predetermined overload takes place.

One of the characteristics of a silicon controlled rectifier is that its gate will not regain control of the current flow through the rectifier until the voltage drop across the rectifier has been reversed or at least brought to zero. In numerous circuits, including the direct current power source to load circuit of the present invention, the removal of excitation to the gate of a silicon controlled rectifier may occur at the time the rectifier is still firing or has just fired, and energy in the circuit may prevent the drop across this rectifier from even reaching zero, thus resulting in the rectifier continuing to pass current every half cycle.

One of the novel features of the present invention includes a reverse "kickback" means which will become operative when excitation to the gate of the silicon controlled rectifier is removed to insure that the voltage drop across the rectifier reaches zero or is reversed.

An object of this invention is to provide a means whereby nonconduction of a silicon controlled rectifier or similar device is assured at the time energization of the gate of such device is terminated.

A further object of the invention is to provide instantaneous cut-off of an electrical circuit when certain predetermined load conditions are exceeded, such cut-off being effected responsive to a substantial reduction in current flow in a control circuit portion due to increased voltage drop across a narrow junction degenerate semiconductor device such as a tunnel diode.

Figure 3:
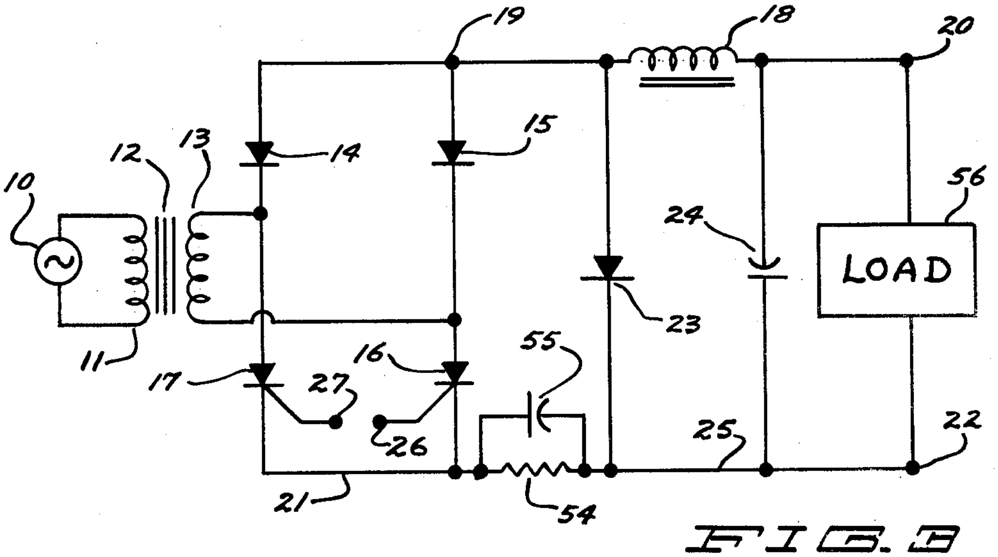
FIG. 3 is a schematic representation of a simplified form of the circuit of FIG. 1 showing the manner in which the silicon controlled rectifiers are positively extinguished.

In the drawings as shown, an alternating current source 10 feeds the primary 11 of a power transformer 12 while the secondary 13 of that transformer is connected to a full wave rectifier including diodes 14 and 15 and silicon controlled rectifiers 16 and 17. In order to provide for continuous filtered flow through the load, choke 18 is connected from a common connection 19 between the two diodes 14 and 15 to a first output terminal 20. A common point 21 between the two silicon control led rectifiers 16 and 17 is connected to a second output terminal 22 by a line 25. A diode 23 is connected between point 19 and line 25, while a capacitor 24 is connected between the end of the choke 18 adjacent first output terminal 20 and the line 25 extending between point 21 and second output terminal 22. This is one form of basic circuit in which the invention can be illustrated, and the components just set out are found both in FIGS. 1 and 3. Also to be found is the representation of a load 56 connected between the output terminals 20 and 22.

Figure 1:
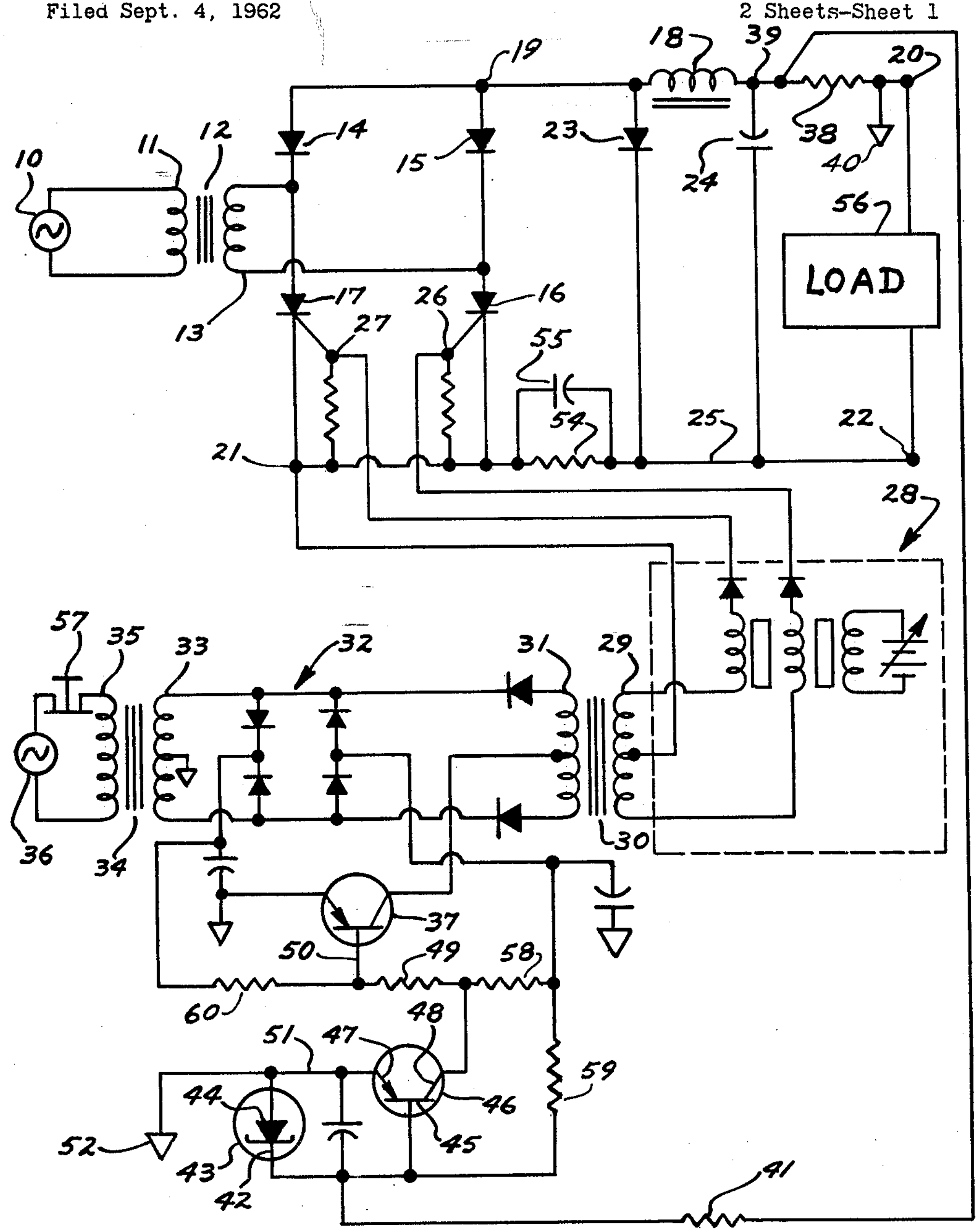
FIG. 1 is a schematic circuit diagram of a direct current power source to load system constructed in accordance with this invention.

As seen in FIG. 1, the gates 26 and 27 of rectifiers 16 and 17, respectively, are connected to the output leads of a magnetic amplifier indicated generally at 28, as is the common point 21 between the two rectifiers. Input to this magnetic amplifier is from the secondary 29 of a transformer 30. The primary 31 of this transformer is energized by a net work indicated generally 32 from a secondary 33 of a transformer 34 which has a primary 35 connected to an alternating current source 36 which may be the same source as indicated at 10.

It is to be noted that all current flow through the primary 31 of transformer 30 passes through a transistor 37. Consequently, as long as the transistor 37 conducts, there can be a control signal to gates 26 and 27, and the D.C. power supply will supply the load across terminals 20 and 22. At the point transistor 37 can no longer fire, this excitation to the gates of the silicon controlled rectifiers 16 and 17 ceases, and assuming that the gates are in control of these rectifiers, no further energy will be supplied to the load.

In order to measure the current passing through the load and to provide a means for interrupting this current should an overload occur, a resistor 38 is inserted between a common connection point 39 of the choke 18 and capacitor 24 on the one hand and first output terminal 20 on the other. Terminal 20 is connected to ground as at 40. A calibrated resistor 41 is connected between common point 39 on the one hand and a cathode 42 of a tunnel diode 43 and a base 45 of a transistor 46 on the other. The anode 44 of tunnel diode 43 is connected to emitter 47 of the transistor 46 at 51 while the collector 48 of that transistor is connected through a resistor 49 to the base 50 of the transistor 37. Common point 51 between anode 44 of the tunnel diode 43 and emitter 47 of transistor 46 is connected to ground as at 52.

It will be seen that the voltage drop across the resistor 38 between point 39 and ground 40 due to current flowing to the load will be split between resistor 41 and tunnel diode 43 between the point 39 and ground 52. Values of resistor 38 and resistor 41 will be chosen such that when the value of the current passing through the load is within allowable limits, the total voltage appearing across the tunnel diode will be less than that between the zero point and the point indicated at 53 in FIG. 2 and the current flow through said diode 43 will be appreciable.

Because of this small voltage drop between the emitter 47 and base 50 of transistor 46, the transistor will not conduct and flows of negative current through a resistor 58 will bias the transistor 37 on in spite of the tendency of positive current through a resistor 60 to bias the transistor to cut-off.

Figure 2:
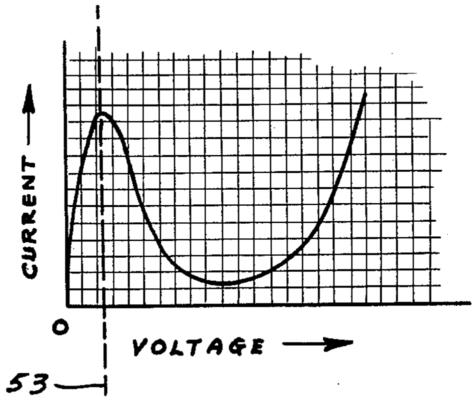
FIG. 2 is a graphical representation of a current-voltage characteristic of a tunnel diode suitable for use in the practice of this invention.

When, however, the load increases beyond the allowable limit, the voltage appearing across the tunnel diode will move to the right of point 53 in FIG. 2, and a very substantial drop in current through the diode will take place. This decrease in current and the consequent increased drop across the tunnel diode and consequently between emitter and base of transistor 46 will cause transistor 46 to conduct. Until this point, current flow through a resistor 59 has been insufficient to cause transistor 46 to fire; but after it does fire, the current flow through the resistor 59 will keep it firing. This current flow causes a drop across a resistor 58 which will cause the base 50 of transistor 37 to swing positive thus cutting off current flow in that transistor. This, as previously explained, will prevent the rectified full wave signal from being impressed upon the primary of transformer 30.

When it is desired to change the value of current flow through the load at which the shut down of power occurs, the resistor indicated 41 will be replaced with one of another value such that the voltage across the tunnel diode will exceed that indicated at 53 in FIG. 2 when the new overload point is reached.

When transistor 37 no longer conducts, no voltage will appear at the gates of the silicon controlled rectifiers 16 and 17, so there will be no power delivered from transformer 12 to the load 56 assuming that the gates of the silicon controlled rectifiers are in control.

In order to insure that both gates regain control of their respective silicon controlled rectifiers, a resistor 54 is inserted in the line 25 between the common point 21 and the diode 23. A capacitor 55 is connected across the resistor 54. The reaction of this circuit can probably best be considered by reference to simplified FIG. 3.

When the voltage is removed from the gates 26 and 27 due to overload in the line, as just described, one or the other of the silicon controlled rectifiers 16 and 17 may be conducting or may just have finished conducting. At this point, there will be a voltage charge across the choke 18 which will discharge back through the diode 23. The drop across this diode, were it not for the resistor 54 and capacitor 55, would be impressed between the point 19 and the line 25 thus to cause a voltage to be impressed across the silicon controlled rectifier during the time this discharge was taking place. Thus, when the forward voltage was again applied from the secondary 13 to this particular silicon controlled rectifier, the gate would not have regained control, and the rectifier would once again conduct. The result would be a half cycle wave impressed on the system rather than a complete shut-off as is desired under those conditions.

However, with the insertion of resistor 54 in the line 25 at the place indicated and with the provision of capacitor 55 across this resistor, a voltage due to the drop across the resistor 54 will build up on the capacitor 55 which will counteract the voltage drop across diode 23. Thus, while choke 18 is discharging back through diode 23, the voltage from point 19 to the other side of the diode 23 will be the same but the presence of an opposite voltage across capacitor 55 will cause the net voltage across the particular silicon controlled rectifiers to be reversed or at least to reach zero. This will allow the gate to again take control. Once this has happened, there will be no further flow through either of the silicon controlled rectifiers and the direct current will be effectively removed from the load.

Once the problem which caused the overload has been eliminated, it is only necessary to interrupt the power from the alternating current source 36 by some such means as opening momentary disconnect switch 57 to allow the network 32 to begin operating as before to cause a signal to be impressed on the magnetic amplifier 28.

What is claimed is:

1. A quick turn-off subcircuit for use with a controlled, filtered, direct current supply circuit to a load including a filter subcircuit connected to said load, a full wave power rectifier subcircuit connected to said filter, said power rectifier subcircuit including a pair of silicon controlled rectifiers having gates, a magnetic amplifier subcircuit exciting said gates, a full wave control rectifier subcircuit feeding said magnetic amplifier subcircuit, a source of alternating electromotive force driving each of said rectifier subcircuits, said quick turn-off subcircuit including a current overload control resistor connected in series with said load between the load and said filter, a transistor having its emitter and collector connected in series between the output of said control rectifier subcircuit and said magnetic amplifier subcircuit, means operative selectively to bias said transistor to cutoff and to permit conduction, said means including a tunnel diode effective when operating over its stable high current state to permit said transistor to conduct and operative in its degenerative low current state to prevent said transistor from conducting, a voltage divider resistor in series with said tunnel diode, said divider resistor and diode being in series with each other and connected together across said control resistor, and reversing means for assuring application of a reverse voltage on said silicon controlled rectifiers when excitation is removed from said gates.

2. The combination as specified in claim 1 wherein said reversing means includes a resistor in series between said power rectifier subcircuit and said filter subcircuit and a capacitor across said resistor.

3. A quick turn-off subcircuit for use with a controlled, filtered, direct current supply circuit to a load including a filter subcircuit connected to said load, a full wave power rectifier subcircuit connected to said filter, said power rectifier subcircuit including a pair of silicon controlled rectifiers having gates, a magnetic amplifier subcircuit exciting said gates, a full wave control rectifier subcircuit feeding said magnetic amplifier subcircuit, a source of alternating electromotive force driving each of said rectifier subcircuits, said quick turn-off subcircuit including a current overload control resistor in series with said load between the load and said filter, a first transistor having its emitter and collector connected in series between the output of said control rectifier subcircuit and said magnetic amplifier subcircuit, a second transistor connected to bias said first transistor to cutoff when said second transistor is not conducting and to bias said first transistor to permit it to conduct when said second transistor is conducting, a voltage divider resistor and a tunnel diode in series with each other, and connected together across said control resistor, said tunnel diode being connected across the emitter and base of said second transistor, and reversing means for assuring application of a reverse voltage on said silicon controlled rectifiers when excitation is removed from said gate.

4. The combination as specified in claim 3 wherein said reversing means includes a resistor in series between said power rectifier subcircuit and said filter subcircuit and a capacitor across said resistor.

References Cited in the file of this patent

UNITED STATES PATENTS

| | | |
|---|---|---|
| 3,037,158 | Schmidt | May 29, 1962 |
| 3,058,034 | Sandin | Oct. 9, 1962 |
| 3,101,439 | Lilienstein et al. | Aug. 20, 1963 |

OTHER REFERENCES

G.E. Controlled Rectifier Manual, 1960 edition, pages 70, 71, 160 and 161.